US010422700B1

(12) United States Patent
Olszak

(10) Patent No.: US 10,422,700 B1
(45) Date of Patent: Sep. 24, 2019

(54) OPTICAL ALIGNMENT BASED ON SPECTRALLY-CONTROLLED INTERFEROMETRY

(71) Applicant: APRE INSTRUMENTS, LLC, Tucson, AZ (US)

(72) Inventor: Artur Olszak, Tucson, AZ (US)

(73) Assignee: APRE INSTRUMENTS, INC., Tucson, AZ (US)

(*) Notice: Subject to any disclaimer, the term of this patent is extended or adjusted under 35 U.S.C. 154(b) by 0 days.

(21) Appl. No.: 15/959,579

(22) Filed: Apr. 23, 2018

Related U.S. Application Data

(60) Provisional application No. 62/488,967, filed on Apr. 24, 2017.

(51) Int. Cl.
*G01J 9/02* (2006.01)
*G03F 9/00* (2006.01)
*G01B 9/02* (2006.01)

(52) U.S. Cl.
CPC ............ *G01J 9/02* (2013.01); *G01B 9/02004* (2013.01); *G01B 9/02068* (2013.01); *G03F 9/7049* (2013.01); *G01J 2009/0253* (2013.01)

(58) Field of Classification Search
CPC ............. G01B 9/02068; G01B 9/02004; G01J 2009/0234; G01J 9/02
See application file for complete search history.

(56) References Cited

U.S. PATENT DOCUMENTS 6,091,552 A * 7/2000 Ueyama ................ H02N 2/025 359/694
7,042,578 B2 * 5/2006 Deck ................. G01B 11/2441 356/514
8,422,026 B2 4/2013 Olszak
8,675,205 B2 3/2014 Olszak
8,810,884 B1 8/2014 Olszak
(Continued)

FOREIGN PATENT DOCUMENTS

JP 2008261728 A * 10/2008

OTHER PUBLICATIONS

Gwynn, Robert B., and Douglas A. Christensen. "Method for accurate optical alignment using diffraction rings from lenses with spherical aberration." Applied optics 32.7 (1993): 1210-1215 (Year: 1993).*

*Primary Examiner* — Shawn Decenzo
(74) *Attorney, Agent, or Firm* — Antonio R. Durando

(57) ABSTRACT

In order to align the various components of an instrument, the beam produced by a spectrally-controlled light source is aligned with the optical axis of the instrument and the first component is placed at its predetermined position along the optical axis. Then, configuring the spectral modulation of the source such that one surface of the component is used as the reference surface, the spectrum of the source is modulated so as to produce a correlogram formed by reflections from the reference surface and from the other surface of the optical component. The correct alignment of the component is determined by adjusting its position so as to cause the correlogram to conform to the bullseye configuration that meets predetermined design parameters. The procedure is repeated with each other component of the instrument, the alignment of each component being based on interference fringes created independently of other components.

15 Claims, 3 Drawing Sheets

(56) References Cited

U.S. PATENT DOCUMENTS

| | | | | |
|---|---|---|---|---|
| 9,581,428 | B2 | 2/2017 | Olszak | |
| 9,581,437 | B2 | 2/2017 | Smythe et al. | |
| 9,618,320 | B2 | 4/2017 | Olszak | |
| 9,696,211 | B2 | 4/2017 | Olszak | |
| 2002/0196450 | A1 * | 12/2002 | Olszak | G01B 11/2441 356/511 |
| 2004/0059540 | A1 * | 3/2004 | Matsumoto | G03F 7/70633 702/150 |
| 2004/0190002 | A1 * | 9/2004 | Schulte | G01B 11/2441 356/512 |
| 2005/0088663 | A1 * | 4/2005 | De Groot | G01B 11/0675 356/497 |
| 2006/0158657 | A1 * | 7/2006 | De Lega | G01B 9/023 356/497 |
| 2010/0309448 | A1 * | 12/2010 | Yamamoto | G01B 11/2441 355/53 |
| 2011/0109962 | A1 * | 5/2011 | Cui | A61B 5/0059 359/385 |
| 2013/0242312 | A1 * | 9/2013 | Olszak | G01B 9/02025 356/497 |
| 2017/0184865 | A1 * | 6/2017 | Doucet | G02B 5/09 |
| 2018/0306575 | A1 * | 10/2018 | Olszak | G01B 11/2441 |
| 2019/0113852 | A1 * | 4/2019 | Ravensbergen | G03F 7/70633 |

* cited by examiner

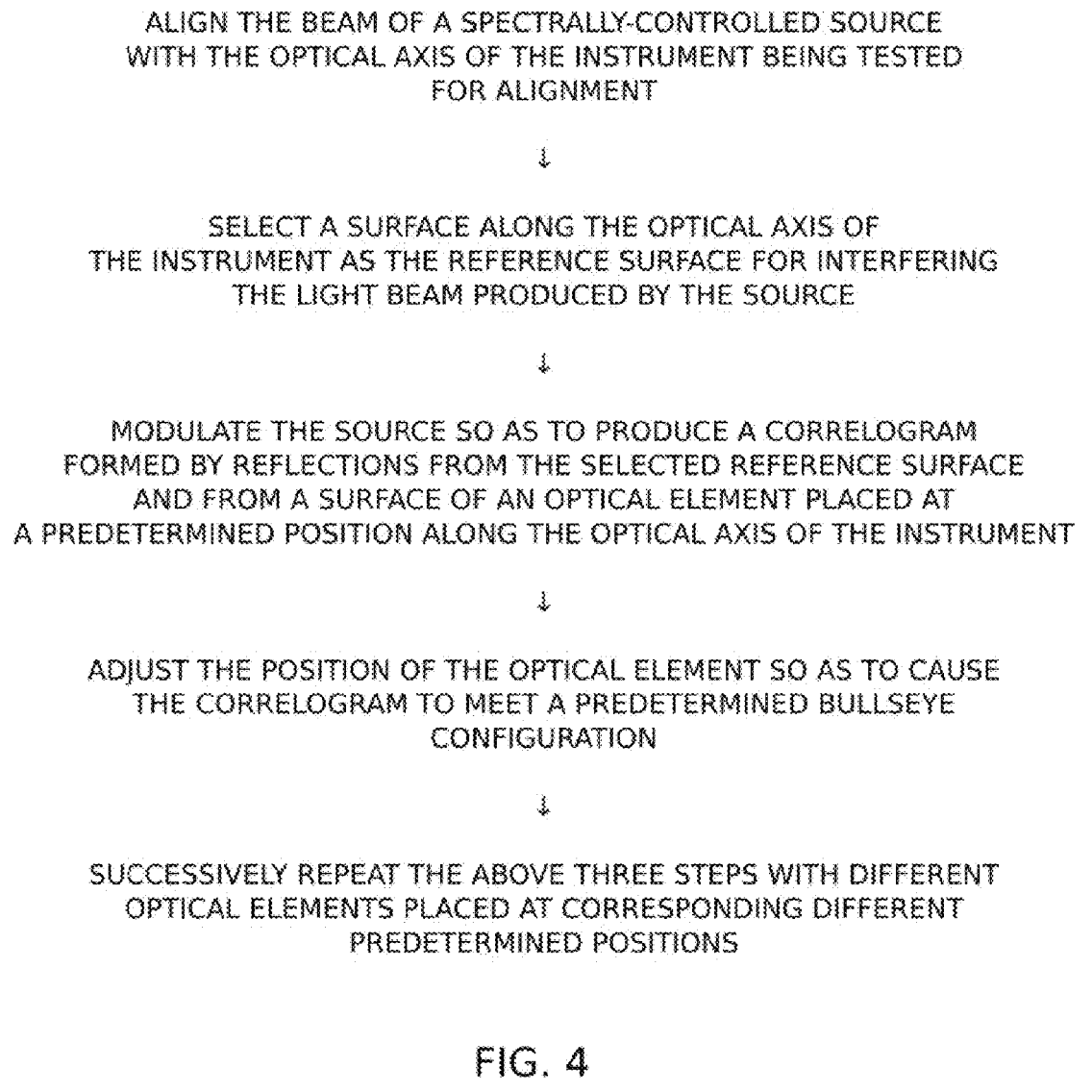

ALIGN THE BEAM OF A SPECTRALLY-CONTROLLED SOURCE WITH THE OPTICAL AXIS OF THE INSTRUMENT BEING TESTED FOR ALIGNMENT

↓

SELECT A SURFACE ALONG THE OPTICAL AXIS OF THE INSTRUMENT AS THE REFERENCE SURFACE FOR INTERFERING THE LIGHT BEAM PRODUCED BY THE SOURCE

↓

MODULATE THE SOURCE SO AS TO PRODUCE A CORRELOGRAM FORMED BY REFLECTIONS FROM THE SELECTED REFERENCE SURFACE AND FROM A SURFACE OF AN OPTICAL ELEMENT PLACED AT A PREDETERMINED POSITION ALONG THE OPTICAL AXIS OF THE INSTRUMENT

↓

ADJUST THE POSITION OF THE OPTICAL ELEMENT SO AS TO CAUSE THE CORRELOGRAM TO MEET A PREDETERMINED BULLSEYE CONFIGURATION

↓

SUCCESSIVELY REPEAT THE ABOVE THREE STEPS WITH DIFFERENT OPTICAL ELEMENTS PLACED AT CORRESPONDING DIFFERENT PREDETERMINED POSITIONS

FIG. 4

OPTICAL ALIGNMENT BASED ON SPECTRALLY-CONTROLLED INTERFEROMETRY

RELATED APPLICATIONS

This application is based on and claims the priority of U.S. Provisional Application Ser. No. 62/488,967, filed Apr. 24, 2017, hereby incorporated by reference.

BACKGROUND OF THE INVENTION

Field of the Invention

The invention relates generally to interferometry. In particular, it relates to a new method for aligning the components of optical instrumentation using spectrally-controlled interferometry.

Description of the Related Art

Optical instrumentation can be quite complex and its performance relies on the precise positioning of each optical element within the assembly. Each element needs to be located within and aligned with the optical axis of the system. Therefore, many different techniques have been developed to address the alignment problem for manufacturing as well as maintenance purposes. A common technique is based on the use of a laser beam as a reference axis; the optical elements of the instrument are placed at the proper location along the axis by observing the interference patterns created by reflections off the various elements' surfaces. However, interpretation of these interference patterns becomes increasingly complex as the number of elements in the system increases.

A typical alignment setup using a laser beam for alignment is shown in FIG. 1. A laser 10 emits a laser beam 12 used to illuminate the optical system through a small hole in a screen 14. As the high-coherence beam 12 propagates through the optical axis 16 of the system, a portion of the beam reflects off each refractive element in the system (for example, beams 18 and 20 from lens 22, and beams 24 and 26 from lens 28). The reflected light propagates in the opposite direction and can be observed on the screen 14. Because the laser beam has a high temporal coherence, the reflected light interferes and forms characteristic so-called bullseye eye patterns that are used to guide the alignment process. The first optical element 22 of the system is typically used to establish a coordinate system by aligning the beam to its optical axis. This is done by manipulating the element so as to center the bullseye with a symmetrical configuration in the image formed on the screen 14, thereby forming the typical interference pattern produced by a single lens, as shown in FIG. 2.

Interpretation of such bullseye interference pattern is simple when only two optical interfaces are present, as in the case of a single lens; however, as more optical elements are added to the alignment path, the interference pattern becomes more and more difficult to interpret because the coherent reflections from each interface in the system interfere in pairs and create patterns wherein it is difficult to discern the cause of misalignments. As a result, this alignment method is also difficult to automate and requires instead skilled personnel, all of which does not lend itself for use in large-scale production. The present invention addresses this problem by applying the properties of spectrally-controlled interferometry.

SUMMARY OF THE INVENTION

The invention lies in the recognition that the properties of spectrally-controlled interferometry (SCI) can be exploited advantageously for a different alignment procedure that makes it possible to align each component based on interference fringes created independently of other components in the optical train of the instrument under alignment. Furthermore, SCI makes it possible to introduce phase shifts in the fringes without physical scanning of the object. Therefore, these two features are particularly suitable for automation of the alignment process.

Another important advantage of the SCI-based approach is its ability to create in space an unambiguous coordinate system that can be easily established by the optical axis of the first optical element. Prior-art methods, such as by auto-collimation, require mechanical means of referencing, typically a high precision air bearing spindle, the axis of which is used for alignment. Such components are expensive and introduce errors to the alignment procedure.

According to the most general approach, the invention is based on the use of a light source capable of spectral modulation to produce a light beam with a varying spectral distribution. As for all SCI applications, such a source is modulated to produce a beam with a temporal coherence such that interference fringes are detectable within the measurement space. The beam produced by the source is first aligned with the optical axis of the instrument and the first optical element to be aligned is placed at its predetermined location along the optical axis. Then, configuring the spectral modulation of the source such that one surface of the element is used as the reference surface for interfering the beam produced by the light source, the spectrum of the source is modulated so as to produce a correlogram formed by reflections from the reference surface and from the other surface of the optical element. The correct alignment of the optical element is determined by adjusting its position so as to cause the correlogram to conform to the bullseye configuration that meets predetermined design parameters. Finally, the procedure is repeated with each other component of the instrument, either using the same reference surface or changing it with a more suitable one from the surfaces already in place along the optical train of the instrument. The spectral modulation required to produce the bullseye correlograms used to align each optical component is preferably carried out with a sinusoidal modulation of the phase of the light produced by the source.

According to another aspect of the invention, the process of placing the optical element to be aligned in the proper predetermined location along the optical axis of the instrument can be carried out by changing the period of modulation of the light source so as to form a maximum contrast correlogram at that predetermined location.

According to yet another aspect of the invention, the beam produced by the SCI source is enlarged by appropriate optics to obtain a higher-resolution interference correlogram. As a result, the surfaces under alignment can be captured and provide more information about the optical system, such as the presence of aberrations that affect the alignment process.

Various other advantages of the invention will become clear from its description in the specification that follows and from the novel features particularly pointed out in the appended claims. Therefore, to the accomplishment of the objectives described above, this invention consists of the features hereinafter illustrated in the drawings, fully described in the detailed description of the preferred embodiment, and particularly pointed out in the claims. However, such drawings and description disclose but a few of the various ways in which the invention may be practiced.

BRIEF DESCRIPTION OF THE DRAWINGS

FIG. 4 is a flow-chart of the essential steps required for practicing the invention.

DETAILED DESCRIPTION OF THE INVENTION

Figure 1:
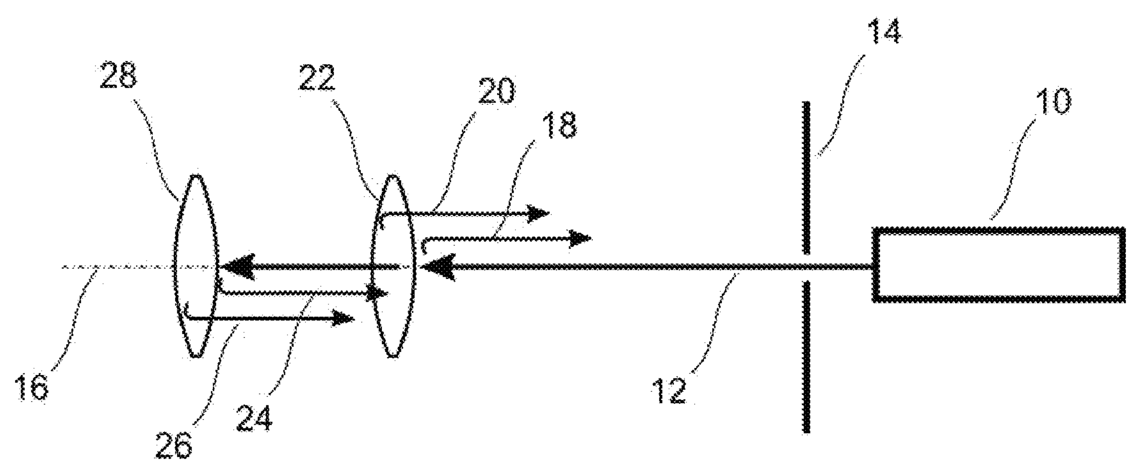
FIG. 1 illustrates schematically a conventional alignment system using a laser beam as a reference for aligning the various elements of the system to its optical axis.
Figure 2:
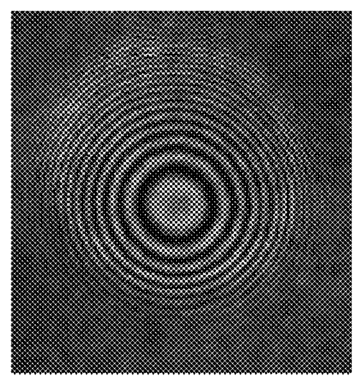
FIG. 2 illustrates the typical bullseye interference pattern formed during the alignment procedure of conventional techniques.

As used in this disclosure, “white light” is intended to refer to any broadband light of the type used in the art of white-light interferometry (WLI), typically having a bandwidth in the order of many nanometers. WLI and CSI (coherence scanning interferometry) are used interchangeably. With reference to light in general, the terms “frequency” and “wavelength” are used alternatively, as commonly done in the art, because of their well-known inverse relationship. “Optical path difference” or “OPD” and “time delay” may be used alternatively because of their space/time relationship in interferometry. As normally done in the art with reference to interferometric apparatus, “optical path difference” and “OPD” are also used to refer to the difference between the lengths of the optical paths of the test and reference arms of the apparatus. Similarly, “sine” and “cosine,” as well as related terms, are used alternatively unless specifically indicated otherwise. The terms “reference surface” and “reference optic” may be used alternatively, as normally done in the art of interferometry. Similarly, the terms “test surface,” “measured surface,” “test article,” “test object,” “test lens” and optical “element” or “component” are all used to refer to the object that is the subject of a measurement. “Optical path difference” or “OPD” and “time delay” may be used alternatively because of their space/time relationship in interferometry. With regard to the process of alignment of optical elements within the optical train of an optical system, the terms “placed” and “intended (or predetermined) location” are used to refer to the initial placement of each optical element along the optical axis of the system, while “position,” “positioning” and “positioned” are generally used to refer to the various positions of an optical element during the process of changing its X/Y, tip/tilt and Z placement during the alignment process.

The terms “modulate” and “modulation” are used in connection with a light source in the broadest sense to include any alteration of the frequency distribution, amplitude distribution or phase distribution of energy produced by the light source, and to also include the synthesis by any means of a light signal having a desired frequency, amplitude or phase distribution. When used in connection with interference fringes, the term “modulation” refers to the fringe envelope. In the case of spectrally-controlled or multiple-wavelength sources, “localized fringes” is intended to mean unambiguously identifiable fringe patterns formed at predetermined distances from the reference surface. Localized fringes are described as positioned at the surfaces from which they are produced to illustrate how they relate to those surfaces and surface shapes that produce them; however, it is understood that physically such localized fringes are only virtual fringes and that actual fringes are in fact formed only at the surface of the detector. Also, the phrase “producing localized fringes at a predetermined position in space” and related expressions are used for convenience, but it is understood that the precise intended meaning is “producing an interferometric environment whereby unambiguously identifiable fringe patterns are produced when a test surface is placed at a predetermined position in space” relative to a reference surface. The terms “fringes,” “fringe patterns,” “interference fringes” and correlograms are used interchangeably within the meaning normally accorded to them in the art. The generic term “interferometry” and related terms should be construed broadly as used in the art and not limited to shape measurements using an imaging interferometer. As such, interferometry is intended to include, without limitation, the measurement of changes in the position of an object, or of thickness of optical elements, using any known interferometric technique. Finally, the term “spectrally controllable light source” is intended to mean any light source capable of spectral modulation, whether the source is a single-component spectrally controllable source, such as currently available lasers capable of spectral modulation, or a multi-component source, such as a source that includes a broadband source and a modulator as separate components.

This invention is based on the use of spectrally-controlled interferometry to facilitate the alignment of optical systems. As described in numerous co-owned publications (see U.S. Pat. Nos. 8,422,026, 8,810,884 and 8,675,205, for example), spectrally-controlled interferometry (SCI) is an interferometric technique that allows the implementation of conventional white light interferometry (WLI) measurement schemes in common path interferometers. WLI (also defined by convention as coherence scanning interferometry, CSI) is characterized by the absence of spurious interference problems (coherent noise) present in conventional laser interferometry because of the light’s short coherence length, typically on the order of a few micrometers. Therefore, the multiple fringe patterns produced by the coherent light used in conventional alignment systems are not formed in a CSI system.

SCI successfully combines the advantages of both common-path interferometry and WLI. It produces localized interference fringes in an unbalanced-OPD interferometer, thereby also allowing the measurement of surfaces within a wide range of space in front of the interferometer. As such, it is suitable for on-axis alignment of the various optical elements of optical instrumentation. As detailed in many SCI-related disclosures and further herein, many different interferometric techniques of analysis can be implemented by manipulating only the spectral properties of a spectrally-controllable light source according to SCI principles.

In essence, spectrally-controlled interferometry is based on the ability to form localized fringes at a predefined distance from the reference surface using an interferometer under unbalanced OPD conditions. For example, by modulating the spectrum of the light source, it is possible to form such localized fringes and, by changing the modality of modulation, it is also possible to phase shift the fringes, which permits the use of modern fringe analysis methods to measure the test article without any physical scanning of the object or reference surface. As such, in addition to practicing interferometry in WLI and conventional laser-interferometry modes with the described advantages, SCI also allows the measurement of isolated surfaces and enables the direct measurement of their distance from the interferometer's reference surface.

The distribution and phase of the fringes produced by an interferometer is governed by the Wiener-Kinchin Theorem (see Born M, Wolf E., *Principles of optics: electromagnetic theory of propagation, interference and diffraction of light,* 7th Expand Ed., Cambridge, N.Y.: Cambridge University Press; 1999) and is expressed as the Fourier Transform of the spectral power distribution of the source. SCI teaches that it is possible to define the location and distribution of the interference fringes in space through modulation of the source's spectrum. For a source with mean wavelength $\lambda_0$, Equation 1 below expresses the distance of the location L of fringe formation (i.e., the peak of fringe contrast) from the reference surface as a function of the period of spectral modulation $\Delta\lambda$, $$L = \frac{\lambda_0^2}{2\Delta\lambda} \quad (1)$$

For example, to form fringes at the distance of 1 meter from the reference surface with a light source operating at a mean wavelength of 500 nm, the period of modulation needs to be 0.125 pm. This property is the basis for the practice of SCI together with any technique used in the art for analyzing fringes, such as scanning white-light and phase-shifting interferometric algorithms.

In most cases it is convenient to modulate the spectrum using a sine function, which produces a single location in the measurement space where fringes are visible (the other locations being at the conjugate location outside the measurement space and at the reference surface's zero OPD). In such case the phase of the fringes is tied to the phase of the modulating signal. Equation 2 below describes the interference pattern resulting from the sinusoidal modulation of the source spectrum, $$I(z, \lambda, \varphi) = 0.5\left[1 + \cos\left(\frac{2\pi z}{\lambda_0} + \varphi\right)\right]\exp\left(-\frac{\left(\Lambda\left(z - \frac{\lambda_0^2}{2\Delta\lambda}\right)\right)^2}{\pi\lambda_0^2}\right) \quad (2)$$

where $\lambda_0$ is wavelength, z is the distance from the zero OPD point (in relation to the reference surface), $\Lambda$ is the total bandwidth of the source, and $\varphi$ is the phase of the spectral modulation. Thus, given a source with fixed, know bandwidth and mean wavelength, it is possible to determine the location of the test surface with respect to the reference surface by determining the wavelength modulation period required to produce fringes of the highest contrast.

Figure 3:
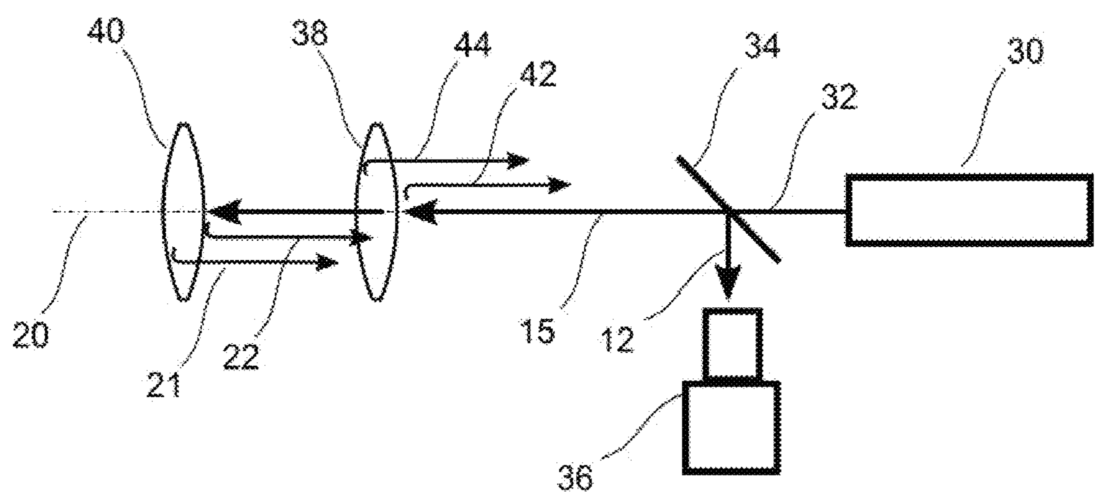
FIG. 3 shows an alignment system based on spectrally-controlled interferometry according to the invention.

Based on these advantages afforded by SCI, FIG. 3 illustrates schematically an exemplary system suitable for aligning optical instrumentation. A spectrally-controllable source 30 is used to produce a narrow alignment beam 32 along the axis of the instrument under alignment, as in the conventional approach. However, instead of the screen 14 illustrated in FIG. 1, a beam splitter 34 is introduced to divert the light reflected back from the optical system toward a camera 36 used to observe and register interference images. The SCI source 30 is controlled to produce changes both in phase and period of modulation to selectively interfere reflections from the various interfaces of the optical system. Because SCI enables the formation of low-coherence fringes at desired locations in space in front of the source, the invention makes it possible to analyze and align each optical component of the instrument individually, without interference from the other elements in the system.

Thus, the alignment procedure relies on selectively interfering beams reflected only from each of the various optical elements along the optical axis of the instrument. It starts by placing the first optical element 38 at its intended location and aligning it with the beam 32 to establish the reference coordinate system. Typically, the direction of light propagation along the optical axis of the instrument is chosen as the Z direction, with X and Y being the orthogonal directions in the plane perpendicular to Z and with the vertex of one of the surfaces of element 38, preferably the first one, being taken as the origin of the coordinate system. The reflections 42 and 44 from the two surfaces of the first optical element 38 are brought to interfere by modulating the source according to Equation 1 such that the distance L is equal to the optical thickness of element 38 along the optical axis of the beam 32. To this end, the two surfaces of element 38 are taken as the reference and test interferometric surfaces, and the interference fringes (the bullseye) produced by reflections upon them are monitored for alignment purposes. The element's position is adjusted until alignment criteria are satisfied by having the bullseye pattern meet a predetermined configuration as measured by optical conformance parameters (such as by measuring the location and symmetry of the fringe intensity pattern or phase registered by the camera).

Next, another element, such as element 40 in FIG. 3, is added to the system and at its intended location and the source is tuned in the same manner to produce interference between the front and back surfaces of the element. The element is then aligned using conventional methods to reduce the resulting fringes to as nearly perfect a bullseye as possible, which can be done by monitoring the fringes visually or by an automated procedure based on fringe pattern analysis. Another element can then be introduced after the second element is aligned and the same procedure can be repeated for aligning this element as well, and so on until every element in the system is aligned according to predetermined quality-control parameters. Because SCI affords the flexibility of forming (and therefore analyzing) correlograms produced by interference between any two surfaces along the beam 32, only fringes produced by the selected surfaces contribute to the bullseye pattern used for alignment purposes, thereby avoiding the spurious fringes present in prior-art coherent-light systems.

Furthermore, in addition to alignment of the X,Y lateral position and the tilt of the optical elements, as in conventional methods, the use of a spectrally-modulated source also allows the positioning of each elements at the correct location (the predetermined design location) along the beam's Z direction because of the localized nature of the interference produced by SCI. By changing the period of the spectral modulation, fringes can be positioned at any desired location in space within the optical system under alignment, thereby also satisfying the need for absolute distance measurements. Using such modulation methods with white light allows the accurate detection of the optical elements along the beam path, so their Z placement can be adjusted to meet the required design parameters. This is another unique feature not present in any other alignment methods.

It is also important to note that, because SCI allows the selective formation of fringes between any two surfaces at any practical location along the optical axis of an instrument being measured for alignment of its elements, each new element measured during the alignment procedure can be anywhere in the instrument, either ahead of or past the Z location of the last measured element. Each alignment step can be conducted visually by a skilled operator watching on a monitor the shape of the bullseye pattern produced by the element under consideration, or automatically, by applying conventional automated procedures where the initial correlogram is analyzed by computerized algorithms and feedback signals are used to drive position-adjustment mechanisms to reposition the element until the last correlogram meets the bullseye pattern meeting predetermined alignment parameters.

Another advantage of the invention lies in the option afforded by the SCI source to use appropriate optics to produce an expanded beam instead of the narrow beam described with reference to FIG. 3. By doing so, higher-resolution interference images of the aligned surfaces can be captured and provide more information about the optical system, such as the presence of aberrations that affect the alignment of the optical system. Furthermore, under these conditions, in addition to the bullseye pattern, other methods can be used to find the correct alignment position of each optical element. For example, aberration contents of the wavefront can give additional information about the position of elements in the system.

Thus, a new method has been disclosed for aligning the elements of an optical system, in terms of Z position as well as X,Y and tip/tilt alignment. The method has two critical advantages over prior art approaches: one is the ability to selectively interfere only two beams at the time by properly choosing the period of spectral modulation; the other is the ability to introduce phase shifts in the fringes, thereby enabling automated methods of analysis. Accordingly, interpretation of fringes during the alignment process and automation are greatly simplified. FIG. 4 is a flow-chart outline of the critical steps involved in practicing the invention. Practical solutions will most likely be more complex and optimized to fit particular problems, but the description given herein provide a sufficient basis for enabling those skilled in the art to understand and build upon the key aspects of the invention.

The invention has been shown and described herein in what is believed to be the most practical and preferred embodiments, but it is recognized that departures can be made therefrom. For example, the reference surface has been described throughout this disclosure as one of the surfaces of one of the optical elements being aligned according to the invention, but it is understood that any other surface placed along the optical axis of the interferometric wavefront during the measurement could be used in equivalent manner. Similarly, the correct Z positioning of the optical elements has been described as carried out preferably by changing the period of modulation of the SCI source so as to identify the position corresponding to maximum contrast. However, those skilled in the art will readily understand that other techniques can be used as well to identify the correct Z position of a test surface, such as the method taught in U.S. Pat. No. 5,398,113. Therefore, the invention is not to be limited to the disclosed details but is to be accorded the full scope of the claims to embrace any and all equivalent apparatus and methods.

The invention claimed is:

1. A spectrally-controlled interferometric method for aligning optical elements along an optical axis, the method comprising the following steps:

providing a light source capable of spectral modulation to produce a light beam with a varying spectral distribution, said beam having a temporal coherence such that interference fringes are detectable within a measurement space along said optical axis;

modulating the light source so as to produce a correlogram formed by reflections from a reference surface and from a surface of an optical element placed at a predetermined location along said optical axis;

adjusting a position of the optical element so as to cause said correlogram to meet a predetermined configuration indicative of optical alignment of the optical element.

2. The method of claim 1, wherein said predetermined location along the optical axis is determined by changing a period of modulation of the light source.

3. The method of claim 2, wherein said period of modulation of the light source is changed so as to form a maximum contrast correlogram when the optical element is positioned at said predetermined location.

4. The method of claim 1, wherein said correlogram is produced by changing a phase of modulation of the light source.

5. The method of claim 1, wherein said correlogram is produced by sinusoidal spectral modulation of the light source.

6. The method of claim 1, wherein said predetermined configuration is a bullseye configuration.

7. The method of claim 1, wherein said reference surface is another surface of the optical element.

8. The method of claim 1, further comprising:

repeating the modulating and adjusting steps with each of additional optical elements placed at a corresponding additional predetermined location along the optical axis.

9. The method of claim 8, wherein said corresponding additional predetermined location along the optical axis is determined by changing a period of modulation of the light source.

10. The method of claim 9, wherein said period of modulation of the light source is changed so as to form a maximum contrast correlogram when each of said additional optical elements is positioned at said corresponding additional predetermined location.

11. The method of claim 9, wherein said correlogram is produced by changing a phase of modulation of the light source.

12. The method of claim 9, wherein said correlogram is produced by sinusoidal spectral modulation of the light source.

13. The method of claim 9, wherein said predetermined configuration is a bullseye configuration.

14. The method of claim 9, wherein said reference surface is another surface of each of said additional optical elements.

15. A spectrally-controlled interferometric method for aligning optical elements along an optical axis, the method comprising the following steps:

providing a light source capable of spectral modulation to produce a light beam with a varying spectral distribution, said beam having a temporal coherence such that interference fringes are detectable within a measurement space along said optical axis;

placing an optical element at a predetermined location along said optical axis;

changing a period of modulation of the light source so as to form a maximum contrast correlogram when the optical element is positioned at said predetermined location;

modulating a phase of the light source sinusoidally so as to produce a correlogram formed by reflections from a test surface and a surface of the optical element;

adjusting a position of the optical element so as to cause said correlogram to meet a predetermined bullseye configuration indicative of optical alignment of the optical element;

placing an additional optical element at an additional predetermined location along the optical axis; and repeating the changing, modulating and adjusting steps with said additional optical element.

* * * * *